(12) United States Patent
Khadilkar (10) Patent No.: US 11,440,056 B2
(45) Date of Patent: *Sep. 13, 2022

(54) OBTAINING CULLET FROM THIN FILM SOLAR MODULES (71) Applicant: Owens-Brockway Glass Container Inc., Perrysburg, OH (US)

(72) Inventor: Chandrashekhar S. Khadilkar, Broadview Heights, OH (US)

(73) Assignee: Owens-Brockway Glass Container Inc., Perrysburg, OH (US)

( * ) Notice: Subject to any disclaimer, the term of this patent is extended or adjusted under 35 U.S.C. 154(b) by 236 days.

This patent is subject to a terminal disclaimer.

(21) Appl. No.: 16/881,636

(22) Filed: May 22, 2020

(65) Prior Publication Data
US 2020/0282432 A1    Sep. 10, 2020

Related U.S. Application Data (63) Continuation of application No. 15/867,181, filed on Jan. 10, 2018, now Pat. No. 10,688,535.

(51) Int. Cl.
B02C 23/10    (2006.01)
B07C 5/342    (2006.01)
(Continued)

(52) U.S. Cl.
CPC .......... B07C 5/3427 (2013.01); B02C 21/00 (2013.01); B02C 23/10 (2013.01); B02C 23/38 (2013.01);
(Continued)

(58) Field of Classification Search
CPC ......... B07C 5/34; B07C 5/342; B07C 5/3427; B02C 23/10; B02C 23/38; B02C 21/00
See application file for complete search history.

(56) References Cited

U.S. PATENT DOCUMENTS 5,758,832 A   7/1998 Grainger
6,384,920 B1  5/2002 Goltsos
(Continued)

FOREIGN PATENT DOCUMENTS

JP    2004273932 A    9/2004
JP    2011173099 A    9/2011
(Continued)

OTHER PUBLICATIONS

Robert W. Birkmire; Erten Eser; Polycrystalline Thin Film Solar Cells: Present Status and Future Potential; Annu. Rev. Mater. Sci. 1997.27:625-53.
(Continued)

Primary Examiner — Matthew Katcoff (57) ABSTRACT

A method of obtaining cullet from a solar module unit is disclosed. The method involves providing a solar module unit in which a detectable tagging material has been applied onto an exposed outer surface of a glass substrate of the solar module unit over one or more electrically conductive contact strips located beneath and visible through the glass substrate. Thereafter, the solar module unit is crushed into assorted module pieces. The assorted module pieces are then sorted by detecting module pieces that include the detectable tagging material and separating the assorted module pieces into a collection of accepted module pieces and a collection of rejected module pieces. The collection of accepted module pieces has module pieces determined not to include the detectable tagging material. Recycled glass is then obtained from the collection of accepted module pieces.

16 Claims, 3 Drawing Sheets (51) Int. Cl.
  B02C 21/00 (2006.01)
  B02C 23/38 (2006.01)
  *H01L 31/02* (2006.01)
  *H01L 31/0445* (2014.01)
  *H01L 31/0296* (2006.01)
  *H01L 31/048* (2014.01)

(52) U.S. Cl.
  CPC ...... *H01L 31/0201* (2013.01); *H01L 31/0296* (2013.01); *H01L 31/0445* (2014.12); *H01L 31/0488* (2013.01)

(56) References Cited

U.S. PATENT DOCUMENTS

| | | | |
|---|---|---|---|
| 6,464,082 | B1 | 10/2002 | Kimmel et al. |
| 7,264,124 | B2 | 9/2007 | Bohlig et al. |
| 7,972,473 | B2 | 7/2011 | Wagner et al. |
| 8,205,813 | B2 | 6/2012 | Lambert et al. |
| 8,340,929 | B2 | 12/2012 | Smaidris et al. |
| 2013/0206651 | A1 | 8/2013 | Huber |
| 2015/0050548 | A1 | 2/2015 | Meissner et al. |

FOREIGN PATENT DOCUMENTS

| | | |
|---|---|---|
| JP | 2013202421 A | 10/2013 |
| WO | 2013057035 A1 | 4/2013 |

OTHER PUBLICATIONS

Nicola Romeo; "The Thin Film Solar Cell based on CdTe: Toward the Industrial Production"; The Abdus Salam; International Centre for Theoretical Physics; Oct. 17-29, 2005.

Kari Larsen; End-of-life PV: then what? Recycling solar PV panels; renewable energy focus.com; Aug. 3, 2009.

Held, Michael, "Life Cycle Assessment of CdTe Module Recycling," University of Stuttgart, Leinfelden-Echterdingen, Germany, pp. 1-6 (2009) (retrieved from https://www.icpds.com/assets/planning/final-environmental-impact-reports/campo-verde-solar/life-cycle-cdte.pdf).

Ben Minnaert, "Thin Film Solar Cells: An Overview," pp. 1-40 (2008) (retrieved from https://biblio.ugent.be/publication/4238935/file/4238983.pdf).

OBTAINING CULLET FROM THIN FILM SOLAR MODULES

The present disclosure is directed to a method of obtaining cullet from a thin film solar module unit using a detectable tagging material and, in a preferred embodiment, to a method of obtaining cullet of the soda-lime-silica variety from a Cd/Te thin film solar module unit.

BACKGROUND

Soda-lime-silica glass is used extensively throughout the glass manufacturing industry to fabricate a number of glass articles including glass containers (e.g., bottles, jars, etc.), products derived from flat glass (e.g., windowpanes, glass walls, doorpanes, windshields, etc), and glass fibers, to name but a few examples. Soda-lime-silica glass is typically formed as an amorphous inorganic solid that includes 60 wt % to 80 wt % silica, 8 wt % to 18 wt % sodium oxide, 5 wt % to 15 wt % calcium oxide, and optionally 0-2 wt % aluminum oxide ($Al_2O_3$), 0-4 wt % magnesium oxide (MgO), 0-1.5 wt % potassium oxide ($K_2O$), 0-1 wt % iron oxide ($Fe_2O_3$), 0-0.5 wt % titanium oxide ($TiO_2$), and 0-0.5 wt % sulfur trioxide ($SO_3$), plus a variety of other optional materials. The amorphous nature of the glass allows it to be reclaimed and reused during the manufacture of new soda-lime-silica glass articles. For example, recycled glass—typically referred to in the industry as "cullet"—of the soda-lime-silica variety may be combined with virgin raw materials (e.g., sand, soda ash, limestone, etc.) to provide a raw material feedstock that is fed to a furnace and melt processed in the conventional way.

Cullet is used in glass forming operations to reduce furnace energy consumption while also achieving other economic and process efficiencies. The inclusion of cullet in the raw material feedstock reduces furnace energy consumption since melting cullet requires less energy than melting virgin raw materials due to the fact that cullet is already chemically homogenized glass and, therefore, does not have to proceed through lengthy and complex endothermic glass forming reactions within the furnace. Mixing cullet into the raw material feedstock also reduces the amount of virgin raw materials that are consumed, which, in turn, reduces the amount intermediate corrosive oxides that are produced in the glass melt. The ability of cullet to decrease furnace energy consumption and contribute to a less corrosive glass melt can extend the service life of the furnace by, on average, up to 30%, while at the same time improving furnace output. Moreover, the addition of cullet to the raw material feedstock simplifies operation of the furnace by reducing the amount of $CO_2$ and other gas emissions that need to be managed.

Cullet has traditionally been acquired from the contingent of waste glass produced at a glass manufacturing plant as well as from post-consumer glass recycling operations including municipal and/or commercial recycling facilities. While these sources of cullet can meet glass manufacturing consumption needs and schedules in most instances, the cullet acquired from those sources is subject to a certain level of variability, even within the same batch or lot, particularly with respect to the color of the glass. These types of sourced cullet may also include foreign residual impurities from contaminants such as paper, plastic, adhesives, ceramics, bottle caps, metals, dirt, and other impurities found in a post-consumer or industrial waste glass stream. The extent to which the acquired cullet has been cleaned of residual impurities and sorted according to color can affect how much of the cullet can be included in the raw material feedstock for a particular glass forming operation. For instance, in the production of flint glass articles, the cullet used is typically restricted to flint glass cullet only, while in the production of green or amber glass articles there is more leeway to mix cullet of different colors.

An attractive source of cullet that does not exhibit the variances inherent in standard post-consumer and industrial waste glass operations can be found in the solar energy industry. Specifically, thin film solar modules include glass substrates made of low iron soda-lime-silica glass that sandwich a thin film photovoltaic circuit having multiple thin film solar cells. A superstrate configured Cd/Te thin film solar module, for example, includes a front contact of one or more transparent conducting oxide (TCO) layers deposited onto an inner surface of a front glass substrate, a cadmium sulfide (CdS) n-type semiconductor layer and a cadmium telluride (CdTe) p-type semiconductor layer deposited in that order onto the front contact of TCO layer(s), and a back contact of one or more layers of electrically conductive material deposited onto the CdTe semiconductor layer. These layers are laser and/or mechanically scribed to a high precision during manufacture of the module—often referred to as the P1, P2, and P3 scribs—to divide the module into monolithically integrated individual solar strip cells. The solar cells are then encapsulated by an adhesive layer, which is typically composed of ethyl vinyl acetate (EVA), to protect the cells and adhere the thin-film coated front glass substrate to a back glass substrate. Additionally, in order to facilitate the delivery of current to and from a given module via a junction box, one or more electrically conductive contact strips including interconnect bars and bus bars are disposed across the back contact of the various cells. The electrically conductive contact strips may be composed of a metal such as solder-coated copper. An example of a commonly-employed solder-coated copper is tin-coated copper.

The recovery of soda-lime-silica cullet from spent thin film solar modules is challenging since current recycling techniques are unable to cleanly isolate and separate the substrate glass from other materials of the module—most notably the adhesive layer and the electrically conductive contact strips. For instance, in current recycling processes for Cd/Te solar modules, the solar module or a portion of the solar module is jaw crushed and hammer milled into small pieces. The pieces of the front glass substrate include TCO and semiconductor material since there is strong adhesion between the front glass substrate and the TCO and semiconductor layers, but poor adhesion between the semiconductor layers and the adhesive layer, especially if the adhesive layer is EVA. The pieces of the of the back glass substrate, on the other hand, include adhesive layer material and possibly remnants of the electrically conductive contact strips that are embedded in and adhered to the adhesive layer. At present, there is no way to efficiently and adequately remove the contact strip remnants from the pieces of the back glass substrate. In that regard, if the electrically conductive contact strips are formed of solder-coated copper, the cullet obtained from the Cd/Te solar modules tends to have an unacceptably high copper content when melted, which is problematic since copper contamination can lead to commercial variations in subsequently manufactured glass articles.

SUMMARY OF THE DISCLOSURE

The present disclosure describes a method of obtaining cullet from a thin-film solar module unit. The term "solar module unit" as used herein refers to any type of thin film solar module component that includes recoverable glass including, for example, a complete thin film solar module itself (minus any framing or other mounting accessories used to assemble the module in to a larger panel or array) or a portion of a thin film solar module. Portions of thin film solar modules that may constitute the solar module unit include scraps of a broken thin film solar module as well as sectioned portions of a thin film solar module that have been cut or otherwise subdivided into smaller segments prior to recycling. The present disclosure embodies a number of aspects that can be implemented separately from or in combination with each other to obtain cullet, which is suitable for future glass forming operations, from thin film solar module units despite the fact that such units may include several different thin film layers, including thin film semiconductor layers, as well as one or more electrically conductive contact strips typically embedded within and distributed throughout an adhesive layer that encapsulates the photovoltaic circuit and bonds the front and back glass substrates together.

According to one aspect of the present disclosure, a method of obtaining cullet from a thin film solar module unit comprises, first, applying a detectable tagging material onto an exposed outer surface of a glass substrate of the thin film solar module unit. The detectable tagging material, more specifically, is applied over one or more electrically conductive contact strips located beneath and visible through the glass substrate. The thin film solar module unit is then crushed into assorted module pieces. The assorted module pieces are sorted by detecting the module pieces that include the detectable tagging material and separating the assorted module pieces into (1) a collection of accepted module pieces and (2) a collection of rejected module pieces. The collection of accepted module pieces has module pieces determined not to include the detectable tagging material and, conversely, the collection of rejected module pieces has module pieces determined to include the detectable tagging material. Recycled glass is then obtained from the collection of accepted module pieces.

According to another aspect of the present disclosure, a method of obtaining cullet from a Cd/Te thin film solar module unit that comprises, in order, from a transparent front surface to a transparent back surface of the module unit, at least a front glass substrate having an exposed outer surface that provides the transparent front surface, an electrically conductive front contact, a CdS semiconductor layer, a CdTe semiconductor layer, an electrically conductive back contact, an adhesive layer, and a back glass substrate having an exposed outer surface that provides the transparent back surface of the module unit. Additionally, each of the front and back glass substrates is composed of soda-lime-silica glass, and one or more electrically conductive contact strips extend across the back contact and are embedded within the adhesive layer. The contact strip(s) are composed of solder-coated copper and are visible through the back glass substrate.

The method of this aspect further involves applying a detectable tagging material onto the exposed outer surface of the back glass substrate of the Cd/Te thin film solar module unit. The detectable tagging material, more specifically, is applied over the one or more electrically conductive contact strips located beneath the back glass substrate and within the adhesive layer so as to establish a color differential against the adhesive layer. Next, the Cd/Te thin film solar module unit is crushed into assorted module pieces that include module pieces that have the detectable tagging material and module pieces that do not have the detectable tagging material. The module pieces that have the detectable tagging material are comprised of a portion of the back glass substrate and a portion of the adhesive layer adhered to the portion of the back glass substrate.

The module pieces that include the detectable tagging material are then detected by optically recognizing on those module pieces the color differential established between the detectable tagging material and the portion of the adhesive layer that is adhered to the portion of the back glass substrate. The assorted module pieces are separated into (1) a collection of accepted module pieces and (2) a collection of rejected module pieces. The collection of accepted module pieces has module pieces determined through detection not to include the detectable tagging material and, conversely, the collection of rejected module pieces has module pieces determined through detection to include the detectable tagging material. The collection of accepted module pieces is further processed to isolate and thereby obtain recycled glass.

BRIEF DESCRIPTION OF THE DRAWINGS

The disclosure, together with additional objects, features, advantages, and aspects thereof, will be best understood from the following description, the appended claims, and the accompanying drawings, in which:

DETAILED DESCRIPTION

The disclosed method of obtaining cullet from a thin film solar module unit involves selectively tagging an exposed outer surface of a glass substrate of the module unit over one or more electrically conductive contact strips visible through the glass substrate. Such tagging is performed by the application of a detectable tagging material that, for example, is optically detectable. The application of the detectable tagging material allows the module unit to be crushed and the resultant assortment of module pieces to be sorted based on the detection/non-detection of the tagging material. In this way, the module pieces that have the detectable tagging material, and thus may include remnants of the electrically conductive contact strip(s) following crushing, can be identified and separated from the rest of the module pieces prior to further processing of the module pieces to ultimately isolate and obtain recycled glass (i.e., cullet). By removing the module pieces tagged with the detectable tagging material, the cullet yielded by the disclosed method is low iron flint cullet of the soda-lime-silica variety that contains little to no contamination attributed to the contact strip(s). This type of cullet has flexible applications in the glass forming industry as it can be used in the raw material feedstock for both flint and colored glass articles.

Figure 1:
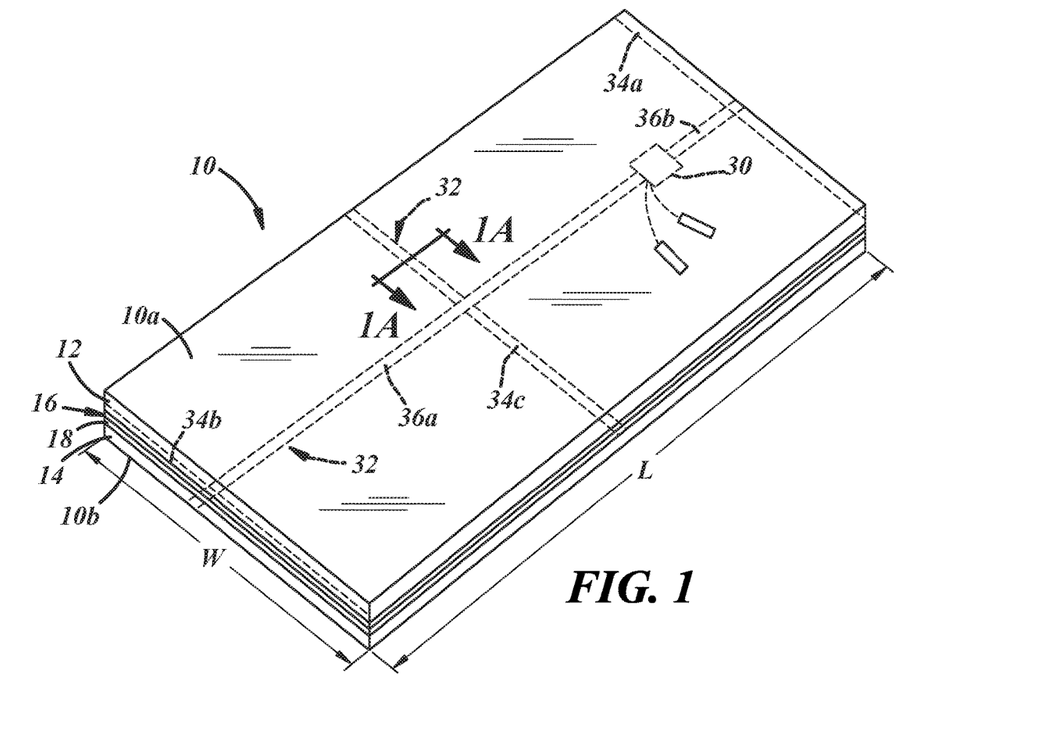
FIG. 1 is a perspective view of a representative thin film solar module that includes a front glass substrate and a back glass substrate which sandwich a photovoltaic circuit comprised of multiple monolithically integrated thin film solar cells.
Figure 1A:
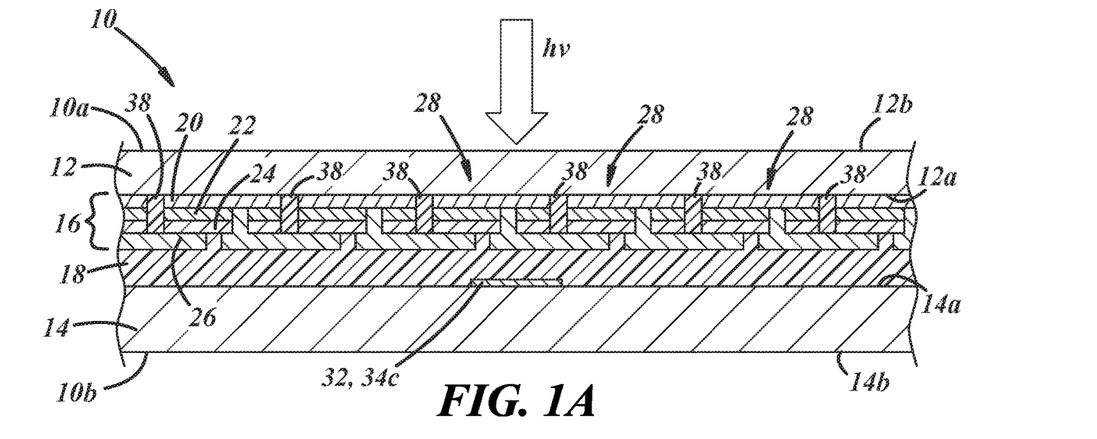
FIG. 1A is a magnified cross-sectional view of a part of the thin film solar module depicted in FIG. 1 and which shows, in idealized fashion and not necessarily to scale, the front and back glass substrates of the module along with the interadjacent thin film layers of the photovoltaic circuit and, additionally, the adhesive layer that includes one or more embedded electrically conductive contact strips.

Referring now to FIGS. 1-1A, the disclosed method is focused on obtaining cullet from a thin film solar module unit that constitutes all or part of a thin film solar module 10. The thin film solar module 10 has a front surface 10a and a back surface 10b, each of which is a transparent glass surface. When installed in a larger solar panel or solar array, the front surface 10a is oriented upwards for direct exposure to sunlight (hv), typically at an angle of incidence as close to perpendicular as possible, and the back surface 10b faces in the opposite direction. To provide the front and back surfaces 10a, 10b, the thin film solar module 10 includes a front glass substrate 12 and a back glass substrate 14. The front glass substrate 12 has an inner surface 12a and an exposed outer surface 12b and may be composed of soda-lime-silica float glass having a low iron content of less than 0.015 wt % Fe. Likewise, the back glass substrate 14 has an inner surface 14a and an exposed outer surface 14b and may be composed of soda-lime-silica tempered glass also having a low iron content. The exposed outer surfaces 12b, 14b of the front and back glass substrates 12, 14 provide the front and back surfaces 10a, 10b of the module 10, respectively.

A thin film photovoltaic circuit 16 is sandwiched between the front and back glass substrates 12, 14 and is encapsulated by an adhesive layer 18 that bonds the inner surfaces 12a, 14a of the glass substrates 12, 14 together. An edge seal (not shown) may also surround the peripheral edge of the photovoltaic circuit 16 in the constructed module 10. The photovoltaic circuit 16 may be based on any thin film photovoltaic system. For example, as described below in more detail, the thin film solar module 10 may be a Cd/Te module. The term "Cd/Te" as used herein refers to a module in which the semiconductor package of the photovoltaic circuit 16 comprises an n-type window semiconductor layer (i.e., a negative, electron donating layer) of cadmium sulfide (CdS) paired with a p-type absorber semiconductor layer (i.e., a positive, electron accepting layer) of cadmium telluride (CdTe) to establish a p-n heterojunction that drives an electrical current flow when sunlight (hv) passes through the front glass substrate 12 and is absorbed by the cadmium telluride semiconductor layer to create electron-hole pairs. While the thin film solar module 10 may include a Cd/Te thin film photovoltaic system within the photovoltaic circuit 16, other types of thin film systems may also be employed in lieu of a Cd/Te system, such as an a-Si (amorphous silicon) photovoltaic system or a CIGS (copper indium gallium selenide) photovoltaic system.

Referring now to FIG. 1A, a partial cross-sectional view of the thin film solar module 10, configured here as a Cd/Te module, is depicted. The Cd/Te thin film solar module includes, in order, from the transparent front surface 10a of the module 10 to the transparent back surface 10b of the solar module 10, at least the front glass substrate 12, an electrically conductive front contact 20, a CdS semiconductor layer 22, a CdTe semiconductor layer 24, an electrically conductive back contact 26, the adhesive layer 18, and the back glass substrate 14. The front contact 20, the CdS semiconductor layer 22, the CdTe semiconductor layer 24, and the back contact 26 are the thin film layers that, in this embodiment, constitute the photovoltaic circuit 16. Moreover, additional thin film layers and materials not explicitly shown may be present within the module 10 between the front and back glass substrates 12, 14 without altering the relative positioning of the thin film layers of the photovoltaic circuit 16 and the adhesive material 18 as illustrated in FIG. 1A.

The front contact 20 may be one or more layers of transparent conductive oxides (TCO) such as a layer of indium tin oxide (ITO) deposited on the inner surface 12a of the front glass substrate 12 and a layer of tin oxide and/or zinc oxide deposited on the ITO layer. The CdS and the CdTe semiconductor layers 22, 24 are respectfully comprised of cadmium sulfide and cadmium telluride, as mentioned before, and are treated as necessary (e.g., annealing in chlorine atmosphere and chemical etching of CdTe) to give those layers 22, 24 their n-type and p-type functionality. The back contact 26 may be one or more layers of metal or another electrically conductive material such as a layer of zinc tellurium (ZnTe) alloy deposited on the CdTe semiconductor layer 24 and a layer of molybdenum deposited on the ZeTe alloy layer. Lastly, the adhesive layer 18, which encapsulates the photovoltaic circuit 16 to protect the photovoltaic circuit 16 from exposure to dirt and humidity, may be comprised of ethyl vinyl acetate (EVA). The adhesive layer 18 is also bonded to the inner surfaces 12a, 14a of the front and back glass substrates 12, 14 in order to hold the front and back glass substrates 12, 14—and thus the module 10—together. Other types of TCO's, electrically conductive materials, and adhesives may of course be used for the front contact 20, the back contact 26, and the adhesive layer 18, respectively, despite not being explicitly enumerated here.

The photovoltaic circuit 16 of the Cd/Te module 10 is preferably superstrate configured. A superstrate configuration refers to the fact that the photovoltaic circuit 16 is fabricated onto the inner surface 12a of the front glass substrate 12 in layered fashion with the understanding and expectation that the front glass substrate 12 will be directly exposed to sunlight (hv) when the resultant module is operational. In other words, during the manufacture of the module 10, the front contact 20 is first deposited onto the inner surface 12a of the front glass substrate 12. The n-type CdS semiconductor layer 22 is then deposited onto the front contact 20 and the p-type CdTe semiconductor layer 24 is deposited onto the n-type CdS semiconductor layer 22. After the semiconductor layers 22, 24 are in place, the back contact 26 is deposited onto the p-type CdTe semiconductor layer 24. Various thin film deposition techniques can be used to deposit the thin film layers 20, 22, 24, 26 including vapor transport deposition, chemical bath deposition, close-space sublimation, sputtering, and electrodeposition, among others.

The photovoltaic circuit 16 is subdivided into multiple monolithically integrated thin film solar strip cells 28 (only a few of which are identified in FIG. 1A) that are formed by laser and/or mechanical scribbing of the thin film layers 20, 22, 24, 26 as the photovoltaic circuit 16 is being fabricated onto the front glass substrate 12. These strip cells 28 are serially interconnected to one another via contact between the front and back contacts 20, 26 of adjacent cells 28 while insulators 38 keep the semiconductor portions of each cell 28 isolated from the semiconductor portions of the other cells 28. Anywhere from one hundred to two hundred strip cells 28 are typically present on a standard sized module. Additionally, to distribute electrical current between the photovoltaic circuit 16 and a junction box 30 disposed on the exposed outer surface 14b of the back glass substrate 14, one or more electrically conductive contact strips 32 including, for instance, bus bars 34 and interconnect bars 36, extend across the back contact 26 of the photovoltaic circuit 16 and are embedded in the adhesive layer 18, as shown in phantom in FIG. 1. The electrically conductive contacts strips 32 may be composed of solder-coated copper and are visible through the back glass substrate 14, although the color differential between the strips 32 and the surrounding adhesive layer 18 generally cannot be reliably detected by standard glass sorting machines as the color contrast is not strong enough. In preferred embodiments, the solder coating is one of Sn—Pb—Ag, Sn—Pb, Sn, or Sn—Ag.

In the presently disclosed Cd/Te module embodiment, and as shown in FIG. 1, the electrically conductive contact strips 32 include a first terminal bus bar 34a, a second terminal bus bar 34b, and a joint bus bar 34c, all of which extend transversely across the back contact 26 in a width direction W that is also parallel to a lengthwise direction of the strip cells 28. The electrically conductive contact strips 32 also include a first interconnect bar 36a and a second interconnect bar 36b that extend longitudinally along the back contact 26 in a length direction L, which is perpendicular to the width direction W, to connect the bus bars 34a, 34b, 34c to the junction box 30 by way of known electrical couplings. Each of the bus bars 34a, 34b, 34c and the interconnect bars 36a, 36b are covered by, and embedded in, the encapsulating adhesive layer 18 and are visible through back glass substrate 14, as previously mentioned. The electrically conductive contact strips 32 cover less than 5% of the surface area of the photovoltaic circuit 16 when the module 10 is viewed from the back through the back glass substrate 14. And when the electrically conductive contact strips 32 are composed of solder-coated copper, as is often the case, each module 10 contains about 650 ppm of copper based on weight.

Figures 2, 3, 4:
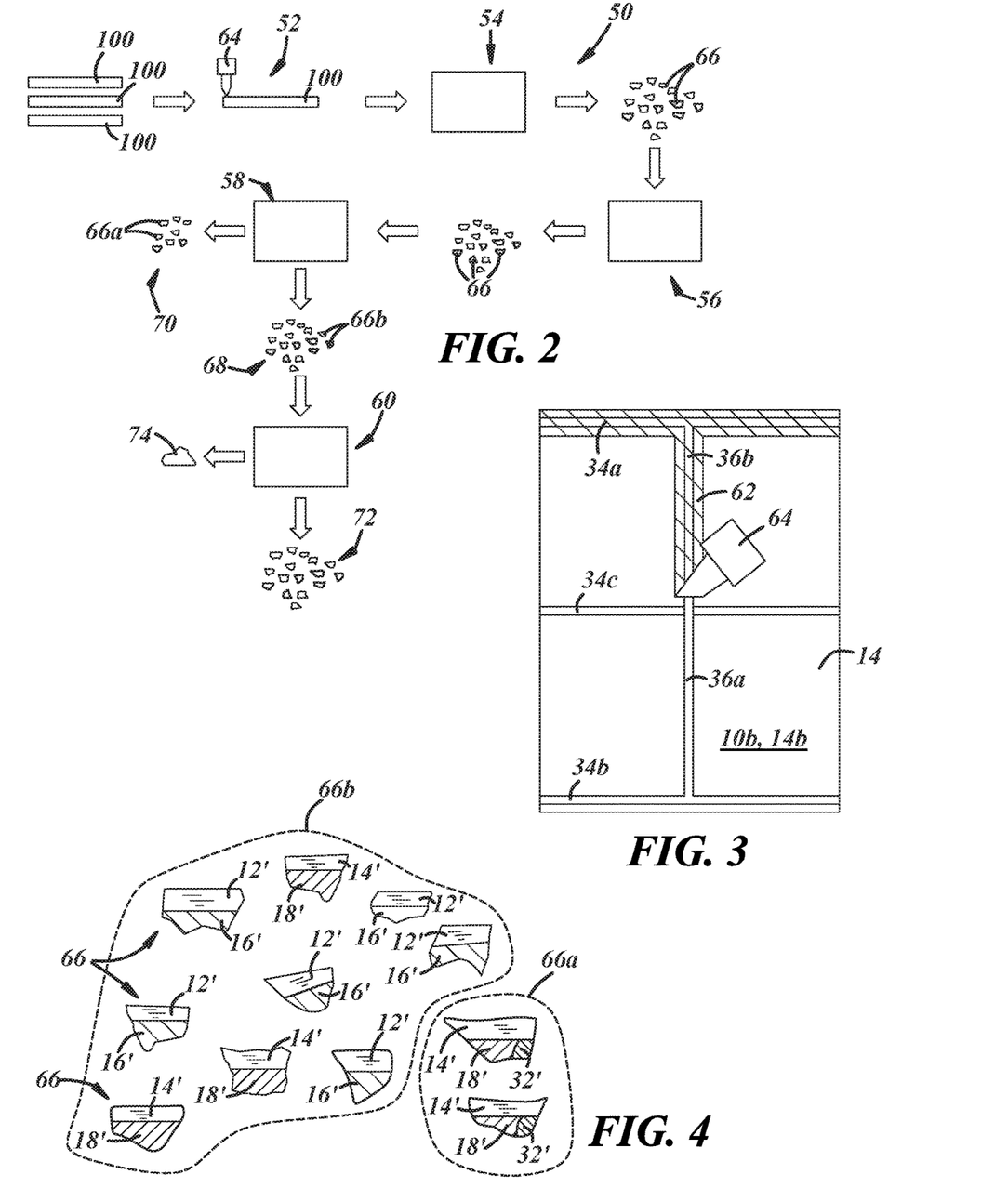
FIG. 2 is a process flow diagram illustrating a method of obtaining cullet from a thin film solar module unit according to one embodiment of the present disclosure.
FIG. 3 is a plan view of a portion of the thin film solar module unit depicted in FIG. 2 during application of the detectable tagging material to an exposed outer surface of a glass substrate of the module unit.
FIG. 4 is a generalized illustration of the assorted module pieces following crushing of the thin film solar module unit that includes module pieces that have the detectable tagging material and module pieces that do not have the detectable tagging material.
Figure 5:
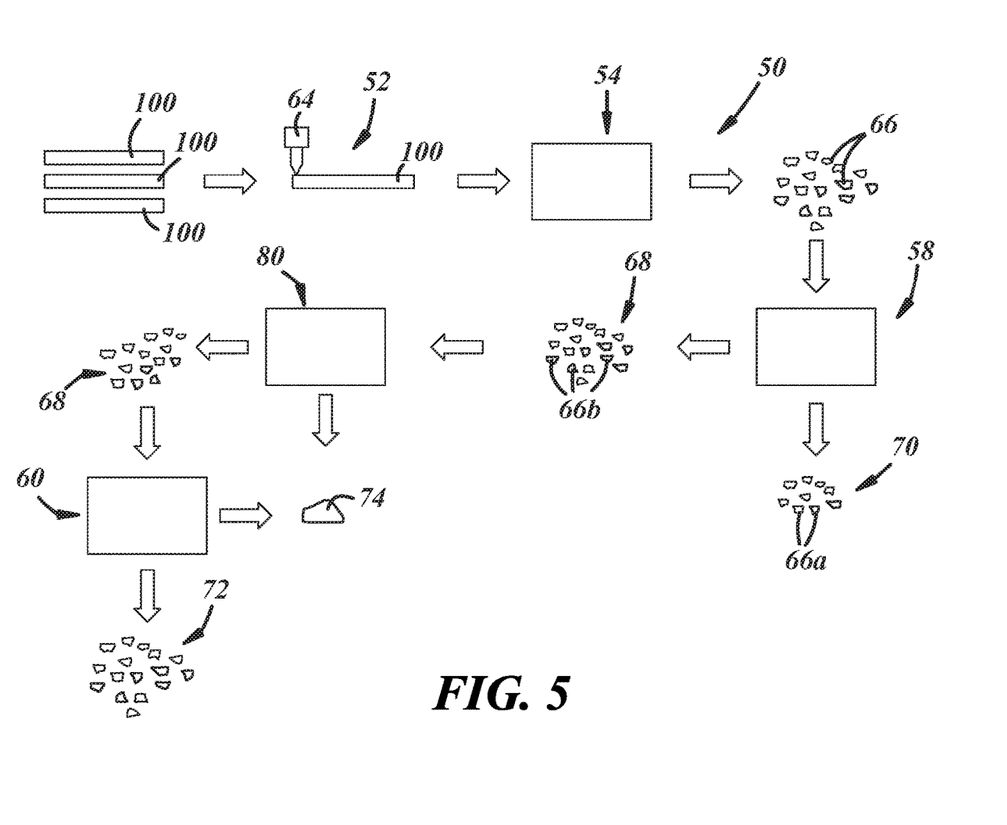
FIG. 5 is a process flow diagram illustrating a method of obtaining cullet from a thin film solar module unit according to another embodiment of the present disclosure.

The expected life of the thin film solar module 10 is currently in the neighborhood of about twenty to twenty five years. Upon exceeding its useful life, the module 10 is decommissioned and recycled. The glass forming industry is interested in obtaining cullet from the front and back glass substrates 12, 14 of the module 10, which can be an economical and dependable source of low iron cullet on the order of 10-15 kilograms per module, while the solar industry is interested in recovering semiconductor material, especially cadmium telluride. A major challenge involved in recycling the thin film solar module 10, however, is that the glass derived from present recycling efforts are often contaminated with remnants of the electrically conductive contact strip(s) 32. These remnants, particularly if they are remnants of solder-coated copper bus bars and/or interconnect bars, may be undesirable to the glass forming industry if present at too high of a concentration in the obtained cullet. The disclosed method can help minimize the contamination of cullet with remnants of the electrically conductive contact strip(s) 32. Referring now to FIG. 2, a thin film solar module recycling method 50 is shown that includes a tagging material application step 52, a crushing step 54, a refining step 56, a sorting step 58, and a cullet processing step 60. An alternative embodiment of the thin film solar module recycling method 50 is shown in FIG. 5 and discussed in more detail below.

In the tagging material application step 52, a thin film solar module unit 100, which can be either the complete thin film solar module 10 or a smaller section of the module 10, is provided for recycling. The thin film solar module unit 100 thus has the same thin film layers and materials (or portions thereof) arranged in the same way as the thin film solar module 10 described above and, as such, the same reference numerals used in FIGS. 1—1A to describe the module 10 are equally applicable to the solar module unit 100. During step 52, and referring now to FIG. 3, a detectable tagging material 62 is applied by way of an applicator 64 to the exposed outer surface 14b of the back glass substrate 14 over the one or more electrically conductive contact strips 32 since, in this Cd/Te thin film module embodiment, the contact strips 32 (e.g., the solder-covered copper bars 34, 36) are visible through the back glass substrate 14 but without the necessary color contrast to enable machine sorting. The application of the detectable tagging material 62 "over" the electrically conductive contact strips 32 means that the detectable tagging material 62, as applied, has a surface area on the exposed outer surface 14b of the back glass substrate 14 that covers the underlying contact strips 32 when viewed from directly above the applied material 62, as illustrated in FIG. 3. While the discussion here and below focuses on applying the detectable tagging material to the exposed outer surface 14b of the back glass substrate 14 in conjunction with the disclosed Cd/Te thin film solar module unit 100, it should be appreciated that the described method 50 can just as easily be performed on a thin film solar module unit where the electrically conductive contact strips 32 are visible through the front glass substrate 12 and, as a result, the detectable tagging material 62 has to applied to the exposed outer surface 12b of the front glass substrate 12.

The detectable tagging material 62 is formulated so that, when applied to the exposed outer surface 14b of the back glass substrate 14, it establishes a color differential against the adhesive layer 18 that is recognizable through optical detection. The established color differential that results from the selective application of the detectable tagging material 62 supports the subsequent sorting step 58 since the adhesive layer 18 and the embedded electrically conductive contact strip(s) 32 are otherwise difficult to distinguish based on color, particularly in those instances when the adhesive layer 18 comprises EVA and the contact strip(s) 32 are solder-coated copper bus bars 34 and interconnect bars 36. In addition to establishing a color differential against the adhesive layer 18, the detectable tagging material 62 should also bond strongly enough to the exposed outer surface 14b of the back glass surface 14 so that it can survive the crushing and refining steps 54, 56 that precede the sorting step 58 in the embodiment of FIG. 2 without being significantly smeared or removed.

A number of different substances may serve as the detectable tagging material 62. In preferred embodiments of the tagging material application step 52, for example, the detectable tagging material 62 may comprise a fugitive dye, a fluorescent dye, a carbon black ink, an organic or inorganic pigmented coating, a paint, or metal flakes, to name but a few options. Moreover, if needed, the detectable tagging material 62 may also include, but is not required to include, other ingredients that support application and adhesion to the exposed outer surface 14b of the back glass substrate 14 such as at least one of the following: one or more dispersants, one or more surfactants, one or more polymers, one or more adhesion promoter additives, and/or one or more solvents. In another embodiment, the detectable tagging material may be a colored tape including, for example, duct tape or a specialty colored organic tape that is commercially available from 3M Company.

After the back glass substrate 14 has been tagged, the thin film solar module unit 100 is crushed in the crushing step 54 into assorted module pieces 66, a grouping of which are shown representatively in FIG. 4. During crushing, the thin film solar module unit 100 is destructibly reduced into the assorted module pieces 66 by way of breaking, shredding, grinding, tearing, and/or some other mechanism that causes the front and back glass substrates 12, 14 to be delaminated. The crushing of the thin film solar module unit 100 into the assorted module pieces 66 may be performed by a jaw crusher that, when operated, provides the module pieces 66 with an average piece size of greater than 4 mm such as, for example, between 4 mm and 20 mm. A typical jaw crusher suitable for the crushing step 54 includes a vertical fixed jaw and a vertical swing jaw that is angled relative to the vertical fixed jaw. The two vertical jaws define, in cross-section, a generally V-shaped crushing chamber that receives the thin film solar unit 100 from above. When the thin film solar unit 100 is contained in the crushing chamber, the vertical swing jaw, which is supported on an eccentric shaft and rotatably driven by a weighted flywheel, is reciprocally moved relative to the vertical fixed jaw to compress and crush the solar unit 100. The assorted module pieces 66 fall out of the crushing chamber as they are formed. Of course, other mechanisms for crushing the thin film solar module 100 may be employed besides jaw crushing.

The assorted module pieces 66 include glass from either the front glass substrate 12 or the back glass substrate 14; that is, some of the assorted module pieces 66 include a portion 12' of the front glass substrate 12 while others include a portion 14' of the back glass substrate 14, as illustrated in FIG. 4. The glass portions 12' from the front glass substrate 12 typically include portions 16' of the photovoltaic circuit 16 while the glass portions 14' from the back glass substrate 14 typically include portions 18' of the adhesive layer 18. This partitioning of materials onto the front and back glass portions 12', 14' occurs because there is strong adhesion between the photovoltaic circuit 16 and the inner surface 12a of the front glass substrate 12 as well as between the adhesive layer 18 and the inner surface 14a of the back glass substrate 14, but relatively weak adhesion between the adhesive layer 18 and the photovoltaic circuit 16. And, for those portions 14' of the back glass substrate 14 that originally covered the one or more electrically conductive contact strips 32 in the solar module unit 100, they may also include remnants of the electrically conductive contact strips 32' adhered to the portion 18' of the adhesive layer 18 due to the strong adhesion between the contact strip(s) 32 and the adhesive layer 18.

The assorted module pieces 66 produced in the crushing step 54 fall into one of two categories: (1) module pieces 66a that include the detectable tagging material 62 (also referred to as "tagged module pieces") and (2) module pieces 66b that do not include the detectable tagging material 62 (also referred to as "untagged module pieces"), as is further illustrated in FIG. 4. Since the detectable tagging material 62 is selectively applied onto the exposed outer surface 14b of the back glass substrate 14 over the electrically conductive metal contact strip(s) 32 during the tagging material application step 52, the tagged module pieces 66a are comprised of a small fraction of the module pieces 66 that include a portion 14' of the glass from the back glass substrate 14. Consequently, the untagged module pieces 66b are comprised of both module pieces 66 that include a portion 12' of the glass from the front glass substrate 12 and a portion 14' of the glass from the back glass substrate 14. Within the assorted module pieces 66, the ratio between the tagged module pieces 66a and the untagged module pieces 66b is oftentimes in the range of 1:50 to 1:10 or, more narrowly, in the range of 1:40 to 1:20.

Following the crushing step 54, the assorted module pieces 66 may be refined, if needed, in the refining step 56 to further reduce the average piece size of the module pieces 66, for example, to between 4 mm and 10 mm. The assorted module pieces 66 may be further refined in an effort to limit the amount of untagged glass that may be present in the tagged module pieces 66a; in other words, if the assorted module pieces 66 have a smaller average piece size, there is less of a chance the tagged module pieces 66a will be accompanied by appreciable amounts of glass that is not tagged, thus improving the amount of cullet recoverable by the recycling method 50. In a preferred embodiment, the refining of the assorted module pieces 66 may be performed by a hammer mill. A typical hammer mill has a rotor mounted to a shaft and a drum that surrounds the rotor. The rotor supports a plurality of hammers that extend radially beyond the circumference of the rotor. When the hammer mill is operational, the assorted module pieces 66 are fed into the interior of the drum, which may include a grinding screen or grate, while the rotor and the drum are experiencing relative rotation. The relatively rotating drum and rotor hammers impact and crush the module pieces 66 to a smaller average piece size before the module pieces can exit the hammer mill. Of course, other mechanisms for refining the assorted module pieces 66 may be employed besides hammer milling.

Next, following the refining step 56, the assorted module pieces 66 are sorted in the sorting step 58. The sorting step 58 involves detecting the tagged module pieces 66a and then, based on the detection response, separating the assorted module pieces 66 into a collection of accepted module pieces 68 and a collection of rejected module pieces 70, as shown schematically in FIG. 2. The detecting and separating can be performed by a glass sorting machine. For example, detecting the tagged module pieces 66a can be carried out by optically recognizing the discernible color differential established between the detectable tagging material 62 and the adhesive layer portion 18' adhered to the portion 14' of the back glass substrate 14 of the tagged module pieces 66a. Then, once detected, the tagged module pieces 66a can be separated from the untagged module pieces 66b by aiming precisely timed and synchronized high pressure air bursts at the tagged module pieces 66a so as to alter the trajectory of the tagged module pieces 66a, without affecting the trajectory of the untagged module pieces 66b, as the assorted module pieces 66 fall freely from a conveyor belt, thus resulting in the tagged module pieces 66a and the untagged module pieces 66b being directed into separate sorting bins or other containers. Some example commercially available glass sorting machines that can perform both the detecting and separating functions are the VETRO cullet sorting machine from SEA (www.seasort.com) and the SORTEX E Polyvision Optical Sorter from Bühler (www.buhlergroup.com).

As alluded to above, the collection of accepted module pieces 68 are those module pieces 66 that have been determined through detection not to include the detectable tagging material 62, and the collection of rejected module pieces 70 are those module pieces 66 that have been determined through detection to include the detectable tagging material 62. In that regard, the collection of accepted module pieces 68 includes all or a vast majority, i.e., greater than 80% by weight, of the untagged module pieces 66b, and the collection of rejected module pieces 70 includes all or a vast majority, i.e., greater than 80% by weight, of the tagged module pieces 66a. While perfect separation of the assorted module pieces 66 may not always be attainable in the sorting machine—due mainly to the fact that the sorting machine may operate with some acceptable margin of error—most if not all of the module pieces 66 that include remnants of the electrically conductive contact strips 32' are nonetheless identified through the applied detectable tagging material 62 and segregated into the collection of rejected module pieces 70. To improve the sorting accuracy of the sorting step 58, the sorting achieved by the glass sorting machine may, if needed or desired, be supplemented by hand sorting the collection of accepted module pieces 68 to remove any tagged module pieces 66a that may have evaded detection or separation in the sorting machine.

After the sorting step 58, recycled glass (i.e., cullet) 72 in particulate or piece form is obtained from the collection of accepted module pieces 68 in the cullet processing step 60. To obtain the recycled glass 72, the glass portions 12' from the front glass substrate 12 and the glass portions 14' from the back glass substrate 14 are isolated by removing adhered portions 16' of the photovoltaic circuit 16 and adhered portions 18' of the adhesive layer 18, respectively, from their surfaces. Such processing may involve leaching the accepted module pieces 68 in a leaching solution. For instance, in a preferred embodiment, the accepted module pieces 68 are added to a rotating leaching drum that includes a leaching solution comprising sulfuric acid and hydrogen peroxide. The leaching solution extracts the CdS and CdTe semiconductor materials to form a leachant 74 and, additionally, detaches any other materials (e.g., other portions 16' of the photovoltaic circuit 16 and portions 18' of the adhesive layer 18) from their respective glass portions 12', 14'. Eventually, after several hours, the leachant 74 is drained from the leaching drum into a classifier and the cleaned glass portions 12', 14' are separated from other loose materials on a vibrating screen. The cleaned glass portions 12', 14' are then rinsed to remove any residual materials to thereby produce the recycled glass 72 in a condition suitable for use as feedstock cullet in subsequent glass forming operations. As for the leachant 74, it and the rinse solution are further processed to reclaim semiconductor material for use by the solar energy industry.

The recycled glass 72 obtained from the recycling method 50 is low iron (less than 0.015 wt % Fe) soda-lime-silica glass that has flexible applications in the glass forming industry including use in a raw material feedstock for both flint and colored glass articles. And because remnants of the electrically conductive contact strip(s) 32' are largely excluded from the collection of accepted module pieces 68, the recycled glass 72 obtained from the recycling method 50 is not overly contaminated from material of the electrically conductive contact strip(s) 32. For example, when the electrically conductive contact strip(s) 32 are composed of solder-coated copper, the concentration of copper in the obtained recycled glass 72 is less than 10 ppm by weight or, more narrowly, less than 5 ppm by weight. The term "ppm by weight" means parts weight per million total parts weight (e.g., 10 ppm by weight can be stated as 10 grams per million total grams). Maintaining a low concentration of copper or other contact strip materials in the recycled glass 72 helps preserve the chemical integrity of the glass melt in which the recycled glass 72 is later incorporated and, as a result, contributes to the minimization of commercial variations in manufactured glass articles.

The recycling method 50 depicted in FIG. 2 and described above can be altered while still serving its purpose to keep electrically conductive contact strip contamination out of the obtained recycled glass 72. To be sure, as illustrated in FIG. 5, the refining step, which is identified by reference numeral 80, may be practiced after the sorting step 58 but prior to the cullet processing step 60. Under this scenario, the assorted module pieces 66 may have an average piece size of 4 mm to 20 mm when sorted in the sorting step 58 with, for example, the aid of a glass sorting machine and optional supplemental hand sorting. Sorting the larger assorted module pieces 66 into the collection of accepted module pieces 68 and the collection of rejected module pieces 70, as previously described, can increase the proficiency of the glass sorting machine in detecting and separating tagged module pieces 66a from the untagged module pieces 66b while also requiring less module pieces 66 to be refined at a later time in step 80 to further decrease the average piece size prior to the cullet processing step 60, if desired. But, as a possible consequence of performing the refining step 80 after the sorting step 58, the potential that some untagged glass will be lost as part of the tagged module pieces 66a increases since the module pieces 66 being sorted are larger and, thus, the tagged module pieces 66a may include larger quantities of untagged glass.

There thus has been disclosed a method of obtaining cullet from a thin film solar module unit that satisfies one or more of the objects and aims previously set forth. The disclosure has been presented in conjunction with several illustrative embodiments, and additional modifications and variations have been discussed. Other modifications and variations readily will suggest themselves to persons of ordinary skill in the art in view of the foregoing discussion. For example, the subject matter of each of the embodiments is hereby incorporated by reference into each of the other embodiments, for expedience. The disclosure is intended to embrace all such modifications and variations as fall within the spirit and broad scope of the appended claims.

The invention claimed is:

1. A method of obtaining cullet from a solar module unit, the method comprising:
    providing a solar module unit in which a detectable tagging material has been applied onto an exposed outer surface of a glass substrate of the solar module unit over one or more electrically conductive contact strips located beneath and visible through the glass substrate;
    crushing the solar module unit into assorted module pieces;
    sorting the assorted module pieces by detecting module pieces that include the detectable tagging material and then separating the assorted module pieces into a collection of accepted module pieces and a collection of rejected module pieces, the collection of accepted module pieces having module pieces determined not to include the detectable tagging material and the collection of rejected module pieces having module pieces determined to include the detectable tagging material; and
    obtaining recycled glass from the collection of accepted module pieces.

2. The method set forth in claim 1, wherein the detectable tagging material establishes a color differential against an adhesive layer adhered to an inner surface of the glass substrate and within which the one or more electrically conductive contact strips are embedded.

3. The method set forth in claim 2, wherein sorting the assorted module pieces comprises optically detecting the module pieces that include the detectable tagging material based on the color differential established between the detectable tagging material and the adhesive layer.

4. The method set forth in claim 1, wherein the detectable tagging material comprises one or more of a fugitive dye, a fluorescent dye, a carbon black ink, an organic or inorganic pigmented coating, metal flakes, or a colored tape.

5. The method set forth in claim 1, wherein the one or more electrically conductive contact strips are composed of solder-coated copper, and wherein the recycled glass obtained from the collection of accepted module pieces has a copper concentration of less than 10 ppm based on weight.

6. The method set forth in claim 1, wherein the method further comprises:
refining the assorted module pieces after crushing the solar module unit, but prior to sorting of the assorted module pieces, to reduce the average piece size of the assorted module pieces.

7. The method set forth in claim 1, wherein the method further comprises:
refining the collection of accepted module pieces after sorting of the assorted module pieces.

8. The method set forth in claim 1, wherein the solar module unit comprises a thin film Cd/Te photovoltaic system.

9. The method set forth in claim 1, wherein the solar module unit comprises an a-Si photovoltaic system.

10. The method set forth in claim 1, wherein the solar module unit comprises a CIGS photovoltaic system.

11. A method of obtaining cullet from a solar module unit, the method comprising:
providing a solar module unit that includes a photovoltaic circuit that is encapsulated by an adhesive layer and further includes a glass substrate, the solar module having a detectable tagging material applied onto an exposed outer surface of the glass substrate over one or more electrically conductive contact strips located beneath and visible through the glass substrate on which the detectable tagging material is applied;
crushing the solar module unit into assorted module pieces;
sorting the assorted module pieces by detecting module pieces that include the detectable tagging material and then separating the assorted module pieces into a collection of accepted module pieces and a collection of rejected module pieces, the collection of accepted module pieces having module pieces determined not to include the detectable tagging material and the collection of rejected module pieces having module pieces determined to include the detectable tagging material; and
removing adhered portions of the photovoltaic circuit and adhered portions of the adhesive layer from the collection of accepted module pieces to isolate and obtain recycled glass from the collection of accepted module pieces.

12. The method set forth in claim 11, further comprising:
refining the assorted module pieces before detecting which module pieces include the detectable tagging material to reduce the average piece size of the assorted module pieces.

13. The method set forth in claim 11, further comprising:
refining the collection of accepted module pieces after separating the assorted module pieces into the collection of accepted module pieces and the collection of rejected module pieces, but before removing adhered portions of the photovoltaic circuit and adhered portions of the adhesive layer from the collection of accepted module pieces, to reduce the average piece size of the accepted module pieces.

14. The method set forth in claim 11, wherein the photovoltaic circuit comprises a semiconductor layer of cadmium sulfide paired with a semiconductor layer of cadmium telluride.

15. The method set forth in claim 11, wherein the detectable tagging material establishes a color differential against the adhesive layer within which the one or more electrically conductive contact strips are embedded, and wherein sorting the assorted module pieces comprises optically detecting the module pieces that include the detectable tagging material based on the color differential established between the detectable tagging material and the adhesive layer.

16. A method of obtaining cullet from a thin film solar module unit, the method comprising:
providing a thin film solar module unit that includes a photovoltaic circuit that is encapsulated by an adhesive layer and sandwiched between a front glass substrate and a back glass substrate, the photovoltaic circuit comprising a semiconductor layer of cadmium sulfide paired with a semiconductor layer of cadmium telluride, the thin film solar module further having a detectable tagging material applied onto an exposed outer surface of the front or back glass substrate over one or more electrically conductive contact strips located beneath and visible through the front or back glass substrate on which the detectable tagging material is applied;
crushing the thin film solar module unit into assorted module pieces;
sorting the assorted module pieces by detecting module pieces that include the detectable tagging material and then separating the assorted module pieces into a collection of accepted module pieces and a collection of rejected module pieces, the collection of accepted module pieces having module pieces determined not to include the detectable tagging material and the collection of rejected module pieces having module pieces determined to include the detectable tagging material;
leaching the accepted module pieces in a leaching solution to extract semiconductor materials into a leachant and detach adhered portions of the photovoltaic circuit and adhered portions of the adhesive layer from the collection of accepted module pieces to thereby isolate and obtain recycled glass from the collection of accepted module pieces; and
reclaiming the semiconductor materials from the leachant.

* * * * *